MONOLITHIC SEMICONDUCTOR MIXER APPARATUS
WITH POSITIVE FEEDBACK
Filed March 30, 1961

WITNESSES
John E. Healy Jr.
James H. Young

INVENTORS
Irving F. Barditch &
William Freeman
BY Maury I. Hull
ATTORNEY 3,107,331

MONOLITHIC SEMICONDUCTOR MIXER APPARATUS WITH POSITIVE FEEDBACK

Irving F. Barditch and William Freeman, Baltimore, Md., assignors to Westinghouse Electric Corporation, East Pittsburgh, Pa., a corporation of Pennsylvania Filed Mar. 30, 1961, Ser. No. 99,566
7 Claims. (Cl. 325—451)

This invention relates to improvements in mixing circuits or apparatus, and more particularly to a tuned semiconductor mixer circuit and apparatus.

As will be readily understood by those skilled in the art, it is necessary in superheterodyne radio receivers to have a stage which performs the translation from the input signal frequency to the intermediate frequency. "Mixing," which is the term applied to this process of heterodying, can be carried out in a number of ways, one of which consists in applying a locally generated signal to a network including a biased diode. In conjunction with the input signal, and due to the non-linear characteristics of the diode, there is derived a beat frequency which is extracted from this network by means of a circuit tuned at this intermediate or beat frequency. This method does not have gain; however, multigrid vacuum tubes or transistor tetrodes do have gain when used for mixing. However, all of these prior art structures require the use of circuits tuned to the appropriate frequencies and require the use of inductors. As will be readily understood, in constructing monolithic semiconductor mixers, inductance can not readily be supplied in the present state of the art. The apparatus of the instant invention provides a semiconductor mixer circuit which is as frequency selective as a prior art circuit utilizing inductance, and which has a valuable and useable gain.

In summary, the apparatus of the instant invention in one embodiment thereof consists of an emitter follower transistor driven by a grounded emitter transistor stage, and which has a low pass or other type of phase shift network, which may be a notch filter, coupling the output of the emitter follower to the input of the grounded emitter stage. The local oscillator signal is applied to a tapped load resistor of the grounded emitter stage, while the external input signal is applied to the base of the emitter follower state and the collector of the grounded emitter stage. The amplitude of the local oscillator signal is sufficient to drive the transistor structure into non-linear operation. This results in mixing and the generation of the signal of beat frequency. Since the structure is tuned to be of the highest impedance at the beat frequency rather than at the local oscillator and input signal frequencies, gain is realized for the desired intermediate frequency signal, and other frequencies are attenuated or in effect bypassed to ground.

Accordingly, a primary object of the invention is to provide a new and improved mixer circuit suitable for monolithic semiconductor construction.

Another object is to provide new and improved tuned semiconductor mixer apparatus.

These and other objects will become more clearly apparent after a study of the following specification when read in connection with the accompanying drawings, in which.

Figure 1:
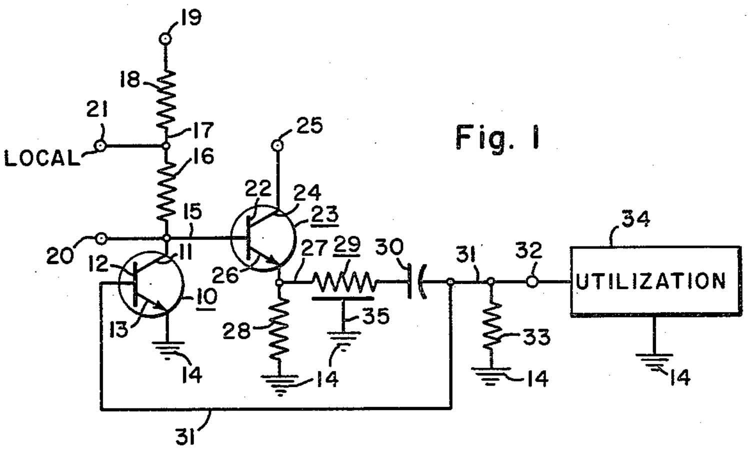
FIGURE 1 is an equivalent electrical circuit diagram of apparatus according to the preferred embodiment of the invention.

Referring now to the drawings, in which like reference characters are used throughout to designate like parts, for a more detailed understanding of the invention, and in particular to FIG. 1 thereof, there is shown a grounded emitter transistor generally designated 10, having a collector 11, base 12 and emitter 13 connected to ground 14. The collector 11 is connected by way of lead 5, resistor 16, lead 17, and resistor 18 to a terminal 19 which is connected to a suitable source of direct current energizing potential of desired polarity, not shown, having the other terminal thereof connected to ground 14. The lead 15 is connected to a signal input terminal 20, whereas lead 17 is connected to a local oscillator injection signal input terminal 21. Lead 15 is connected to the base 22 of an additional transistor generally designated 23 having a collector 24 connected to a terminal 25 which it is understood is connected to a suitable source of direct current energizing potential of desired polarity, not shown, having the other terminal thereof connected to ground 14. The emitter 26 of transistor 23 is connected by way of lead 27 and resistor 28 to ground 14. Lead 27 is connected by way of a phase shift device, generally designated 29, capacitor 30 and lead 31 to an output terminal 32. Lead 31 is connected to the aforementioned base 12 of transistor 10. The resistor 33 is connected from lead 31 to ground 14 and provides a path for biasing the base 12 in a desired and proper manner with respect to the collector 11 and emitter 13 of transistor 10. A utilization device 34 is connected to output terminal 32, the device 34 being any convenient device such, for example, as an additional amplifying stage for amplifying the intermediate frequency or beat frequency signal at terminal 32.

In the operation of the apparatus of FIG. 1, it will be seen that the transistors 10 and 23 with the phase shift network 29, comprise a phase shift feedback circuit, which is tuned in accordance with the frequency selective characteristics of the phase shift network 29, which may be of any convenient design, or which may be similar to a phase shift device described in an article entitled "Distributed Parameter Networks for Circuit Miniaturization" by Charles K. Hager, appearing in the Proceedings of the Joint Electronic Components Conference, I.R.E., A.I.E.E., May 1959, or which, with the addition of a resistor in the grounding leg 35 may be similar to that shown and described in the copending application of W. M. Kaufman for "Narrow Band Rejection Filter and Tunable Monolith for Use Therein," Serial No. 5,045, filed January 27, 1960, and assigned to the assignee of the instant invention. Assuming by way of description that 29 is a band pass or other filter designed to pass the intermediate frequency, the signal applied to the base 12 by way of lead 31 is shifted in phase 180° in the transistor 10, and is shifted in phase, if desired, another 180° in the device 29, providing a feedback path which in effect provides positive (or regenerative) feedback in a highly frequency selective manner, this circuit or path being tuned to the frequency of the intermediate frequency signal or output of the mixer. The local oscillator signal is applied with reference to ground to lead 21, whereas the input signal is applied with reference to ground to terminal 20. The local oscillator signal is preferably of the order of several times the amplitude of the input signal, depending upon the non-linear characteristics of the transistor and the tuned circuit. This amplitude of the local oscillator is sufficient to drive the structure into non-linear operation, resulting in mixing and the generation of the beat frequency signal at an intermediate frequency, which is passed to output terminal 32. In effect, mixing in a non-linear reactance is obtained rather than in a non-linear resistance such as would be provided if the input signal and the local oscillator signal were applied to two grids of a multi-grid electron discharge tube.

Figure 2:
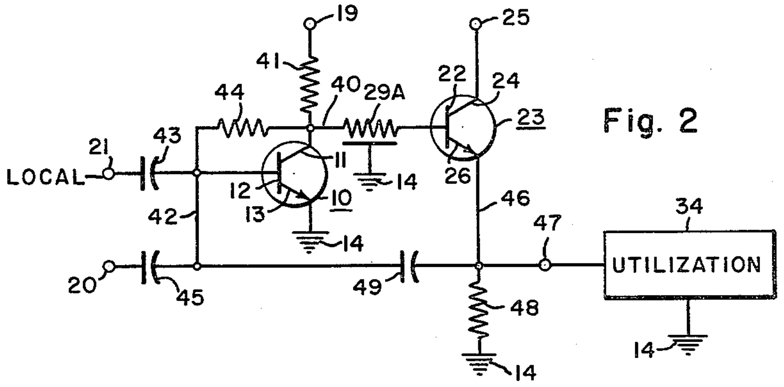
FIG. 2 is an equivalent electrical circuit diagram of apparatus according to another embodiment of the invention.

Particular reference is made now to FIG. 2 in which another embodiment of the invention is shown. Transistor 10 has the collector 11 thereof connected by way of lead 40 and resistor 41 to the terminal 19 which is connected to a suitable source of direct current energizing potential of proper polarity, not shown, having the other terminal thereof connected to ground 14. Base 12 is connected by way of lead 42 and capacitor 43 to a local oscillator signal injection terminal 21. Leads 42 and 40 have resistor 44 connected therebetween for supplying a potential to base 12 for biasing the base 12 in a correct manner with respect to the collector 11 and emitter 13. The signal to be amplified is applied to terminal 20 which is coupled by way of capacitor 45 to the aforementioned lead 42. Lead 40 is coupled through phase shift device 29A to the base 22 of an emitter follower transistor 23 as in FIG. 1. The emitter 26 of transistor 23 is connected by way of lead 46 to output terminal 47 and is also connected by way of resistor 48 to ground 14. Lead 46 is also connected by way of capacitor 49 to the aforementioned lead 42. Collector 24 is connected at terminal 25 to a suitable source of direct current energizing potential of selected polarity, not shown, having the other terminal thereof connected to ground 14.

In the operation of the circuit of FIG. 2, as before the transistor 10 and frequency selective or frequency sensitive phase shift network 29A provide for a substantially 360° phase shift so that positive feedback is supplied for signals of the desired frequency, building up intermediate frequency signals of a frequency to which the network or device 29A is "tuned" or phase shift selective and attenuating other signals. As before, a local oscillator signal injected at terminal 21 drives transistor 10 into the non-linear portion of its voltage-current characteristic curve, and as a result mixing occurs in the circuit of transistor 10, and the intermediate frequency resulting from the mixing of the two signals is fed back as positive feedback, so that in effect the signal of beat or intermediate frequency is amplified by the frequency selective circuit and delivered to the aforementioned output terminal 47 and utilization device 34.

Figure 3:
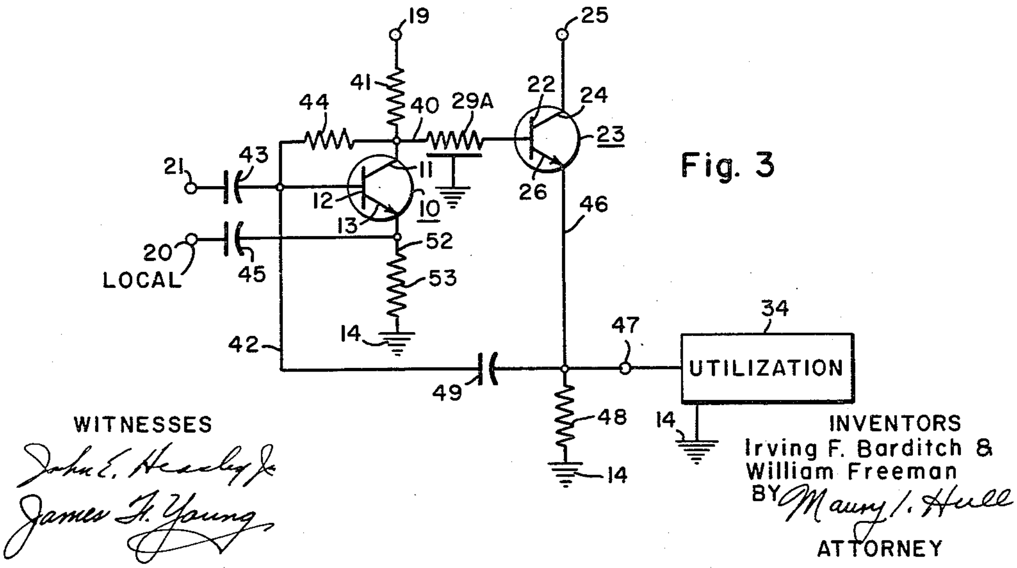
FIG. 3 is an equivalent electrical circuit diagram of apparatus according to a third embodiment of the invention.

Particular reference is made now to FIG. 3, where another embodiment of the invention is shown. FIG. 3 is similar to FIG. 2 except that the signal to be amplified is applied by way of capacitor 43 to base 12, whereas the local oscillator signal is applied by way of capacitor 45 to the emitter 13 of transistor 10, mixing occurring in the transistor 10 as before, which is driven into its non-linear region by the amplitude of the local oscillator signal at terminal 20. It will be seen that in FIG. 3 the emitter 13 of transistor 10 is connected by way of lead 52 and resistor 53 to ground 14. In FIG. 3, resistors 41 and 44 may have somewhat different values than they have in FIG. 2.

The invention includes the use of a plurality of phase shift networks at 29 or 29A if desired.

The term "frequency sensitive" is used to indicate that null networks such as a notch filter, twin-T, or bridged-T, may be used as well as low pass or high pass networks, all of which can supply the necessary phase shift.

In the claims appended hereto it will be understood that separately recited elements such as "transistor," "capacitor," "resistor," "lead," etc. may be suitably doped regions of a single block of semiconductor material.

Whereas the invention has been shown and described with respect to some embodiments thereof which give satisfactory results, it should be understood that changes may be made and equivalents substituted without departing from the spirit and scope of the invention.

We claim as our invention:

1. Mixer apparatus comprising, in combination, a first transistor having a voltage current characteristic curve which is non-linear over at least a portion of the curve, a second transistor connected to and receiving the output of the first transistor, the second transistor being connected as an emitter follower, frequency sensitive phase shifting means connected to the emitter follower transistor, circuit means connecting the output of the phase shifting means to the first transistor to provide a positive feedback path, means for simultaneously applying an input signal and a local oscillator signal to the first transistor, said local oscillator signal being of an amplitude sufficient to drive the first transistor into said non-linear portion of its characteristic curve, said phase shifting means providing a predetermined phase shift at a beat frequency selected from the sum and difference frequencies of the local oscillator signal and the input signal whereby the total phase shift in the first and second transistors and phase shifting means is substantially 360 degrees, and output means connected to the circuit means for delivering a beat frequency output signal component.

2. Mixer apparatus comprising in combination a first transistor having a voltage-current characteristic curve which is non-linear over at least a portion of the curve and having an input signal and a locally generated signal applied thereto, the locally generated signal being of an amplitude sufficient to drive the first transistor into said non-linear portion of its characteristic curve, feedback circuit means connecting the output of the first transistor to the input thereof, said feedback circuit means comprising an additional transistor connected as an emitter follower and a frequency sensitive phase shifting device, said first transistor and frequency sensitive phase shifting device having a total phase shift which provides for regenerative feedback of signals of a beat frequency selected from the sum and difference frequencies of the locally generated signal and the input signal, and output means connected to the feedback circuit means for obtaining an output signal at said beat frequency.

3. A mixer circuit comprising, in combination, a first transistor having a voltage current characteristic curve which is non-linear over at least a portion of the curve, means for applying an input signal and a local oscillator signal to the first transistor, the local oscillator signal being of an amplitude sufficient to drive the first transistor into said non-linear portion of its characteristic curve, a second transistor connected as an emitter follower, a frequency sensitive phase shifting device, circuit means connecting the first transistor, second transistor and frequency sensitive phase shifting device in series to provide a closed feedback loop, said first transistor and phase shifting device providing a 360 degree phase shift to accentuate a preselected beat frequency selected from the sum and difference frequencies of the input signal and the local oscillator signal, and output means connected to the second transistor.

4. Mixing apparatus comprising, in combination, a first triode transistor having a collector, base and emitter, said first transistor having a voltage current characteristic curve which is non-linear over at least a portion of the curve, first and second resistors in series connecting said collector to a suitable source of direct current energizing potential, means for connecting the emitter to a point of reference potential, means for applying a local oscillator signal of at least a predetermined amplitude to the junction between the first and second resistors, means for applying an input signal to said collector, a second triode transistor having the base thereof operatively connected to the collector of the first transistor, circuit means connecting the second transistor as an emitter follower, means for connecting the collector of the second transistor to a suitable source of direct current energizing potential, a frequency sensitive phase shifting network connected to the emitter of the second transistor, other circuit means connecting the output of the frequency sensitive phase shifting network to the base of the first transistor to provide a feedback path, said path being frequency selective at a beat frequency selected from the sum and difference frequencies of the input signal and local oscillator signal, and output means connected to the other circuit means.

5. A mixer comprising, in combination, first input means including first capacitor means, a first transistor having a base, collector, and emitter, the first transistor having a voltage-current characteristic curve which is non-linear over at least a portion of the curve, means for connecting the emitter to a point of reference potential, the first input means being connected to said base, second input means including second capacitor means connected to said base, the first input means and the second input means being adapted to have a local oscillator signal and an input signal applied thereto respectively, the local oscillator signal being of an amplitude sufficient to drive the first transistor into the non-linear portion of said characteristic curve, a second transistor having a base, collector, and emitter and connected as an emitter follower, output means connected to the emitter of the second transistor, feedback circuit means connecting the emitter of the second transistor to the base of the first transistor, means for connecting the collector of the second transistor to a suitable source of direct current energizing potential, and frequency sensitive phase shift means connecting the collector of the first transistor to the base of the second transistor to provide a feedback path and a path for the passage of a signal of a beat frequency selected from the sum and difference frequencies of the local oscillator signal and the input signal, the feedback circuit means and phase shift means providing positive feedback for the signal of said beat frequency thereby building up the amplitude of said last named signal.

6. Mixer apparatus comprising a first transistor having a voltage-current characteristic curve which is nonlinear over at least a portion of the curve, first circuit means adapted to have a local oscillator signal applied thereto for applying the local oscillator signal to the first transistor, second circuit means adapted to have an input signal applied thereto for applying the input signal to the first transistor, the local oscillator signal being of an amplitude sufficient to drive the first transistor into the non-linear portion of its characteristic curve, a second transistor having a base, collector and emitter and being connected as an emitter follower, output means connected to the emitter of the second transistor, feedback circuit means connecting the emitter of the second transistor to the first transistor, means for connecting the collector of the second transistor to a suitable source of direct current energizing potential, and frequency sensitive phase shift means connecting the first transistor to the base of the second transistor to provide a frequency selective feedback path, said feedback path having a total phase shift in a manner to accentuate a beat frequency selected from the sum and difference frequencies of the input signal and local oscillator signal and to attenuate all other frequencies.

7. A mixer comprising, in combination, a first transistor having a base, collector, and emitter and having a voltage current characteristic curve which is non-linear over at least a portion of the curve, means for applying a local oscillator signal to the emitter of the first transistor, means for applying an input signal to the base of the first transistor, a second transistor having a base, collector, and emitter and being connected as an emitter follower, means for connecting the emitter to a point of reference potential, output means connected to the emitter of the second transistor, feedback means connecting the emitter of the second transistor to the base of the first transistor, and frequency sensitive phase shift means connecting the collector of the first transistor to the base of the second transistor, said frequency sensitive phase shift means passing with a predetermined phase shift a signal having a beat frequency selected from the sum and difference frequencies of the local oscillator signal and input signal whereby the total phase shift of the signal of beat frequency is such as to provide positive feedback for said last named signal.

References Cited in the file of this patent

UNITED STATES PATENTS

| | | |
|---|---|---|
| 2,856,520 | Lin | Oct. 14, 1958 |
| 2,880,312 | Koch | Mar. 31, 1959 |
| 2,935,607 | Koch | May 3, 1960 |

OTHER REFERENCES

"Philco Transistor Data Sheet T1696," October 1959 (3 pages).